US012795894B2

(12) United States Patent
Kim et al.

(10) Patent No.: US 12,795,894 B2
(45) Date of Patent: Nov. 10, 2026

(54) SEMICONDUCTOR DEVICE AND METHOD FOR FABRICATING THE SAME

(71) Applicant: SK hynix Inc., Gyeonggi-do (KR)

(72) Inventors: Yu Jin Kim, Gyeonggi-do (KR); Dong Hyun Lee, Gyeonggi-do (KR); Se Hun Kang, Gyeonggi-do (KR); Kyung Woong Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 497 days.

(21) Appl. No.: 18/335,138

(22) Filed: Jun. 15, 2023

(65) Prior Publication Data

US 2024/0206154 A1 Jun. 20, 2024

(30) Foreign Application Priority Data

Dec. 20, 2022 (KR) ........................ 10-2022-0179490

(51) Int. Cl.
*H10B 12/00* (2023.01)
*H10D 1/68* (2025.01)

(52) U.S. Cl.
CPC ......... *H10B 12/315* (2023.02); *H10B 12/033* (2023.02); *H10D 1/696* (2025.01); *H10D 1/716* (2025.01)

(58) Field of Classification Search
CPC .... H10B 12/03; H10B 12/033; H10B 12/315; H10D 1/014–043; H10D 1/696; H10D 1/716
See application file for complete search history.

(56) References Cited

U.S. PATENT DOCUMENTS

| | | | | |
|---|---|---|---|---|
| 2006/0040444 | A1* | 2/2006 | Lee | H01G 9/00 257/E21.018 |
| 2013/0256769 | A1* | 10/2013 | Jeong | H10B 12/31 257/296 |
| 2020/0395438 | A1* | 12/2020 | Kang | H01G 4/1254 |
| 2022/0399435 | A1 | 12/2022 | Lee et al. | |

* cited by examiner

*Primary Examiner* — Molly K Reida
(74) *Attorney, Agent, or Firm* — IP&T GROUP LLP

(57) ABSTRACT

A semiconductor device includes: a data storage element including a first electrode disposed over a semiconductor substrate, wherein the first electrode includes: a pillar body which is oriented perpendicular to a surface of the semiconductor substrate and which includes a tapered sidewall; and a sealing layer covering the tapered sidewall of the pillar body.

18 Claims, 5 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2022-0179490, filed on Dec. 20, 2022, which is incorporated herein by reference in its entirety.

BACKGROUND

1. Field

Various embodiments of the present invention relate to a semiconductor device, and more particularly, to a semiconductor device including a data storage element, and a method for fabricating the same.

2. Description of the Related Art

Recent demands for high-integration semiconductor memories have resulted in smaller unit cell areas and lower operation voltages for the memories. These memories have utilized high-k materials having a high capacitance and a low leakage current compared to memories without the high-k materials.

SUMMARY

Embodiments of the present invention are directed to a semiconductor device including a data storage element with improved reliability, and a method for fabricating the semiconductor device.

In accordance with one embodiment of the present invention, a semiconductor device includes: a data storage element including a first electrode disposed over a semiconductor substrate, wherein the first electrode includes: a pillar body which is oriented perpendicular to a surface of the semiconductor substrate and which includes a tapered sidewall; and a sealing layer covering the tapered sidewall of the pillar body.

In accordance with another embodiment of the present invention, a method for fabricating a data storage element includes: sequentially forming a first electrode, a dielectric layer, and a second electrode, at least the first electrode including a vertical sidewall disposed over a semiconductor substrate, wherein the forming of the first electrode including the vertical sidewall includes: forming a pillar body having a tapered sidewall over the semiconductor substrate; forming a sealing layer on the tapered sidewall of the pillar body; and selectively etching the sealing layer to form the vertical sidewall.

In accordance with still another embodiment of the present invention, a data storage element includes: a first electrode which is oriented vertically over a semiconductor substrate and has a vertical sidewall; a dielectric layer over the first electrode; and a second electrode over the dielectric layer, wherein the first electrode includes: a pillar body which is oriented perpendicular to a surface of the semiconductor substrate and includes a tapered sidewall; and a sealing layer suitable for covering the tapered sidewall of the pillar body and providing the vertical sidewall.

In accordance with yet another embodiment of the present Invention, a data storage element includes: a first electrode which is oriented vertically over a semiconductor substrate and includes vertical sidewalls and tapered sidewalls; supporters suitable for supporting the tapered sidewalls of the first electrode; a dielectric layer suitable for covering the vertical sidewalls of the first electrode and the supporters; and a second electrode over the dielectric layer, wherein the first electrode includes: a pillar body which is oriented perpendicular to the surface of the semiconductor substrate and includes a tapered sidewall; and sealing layers suitable for covering the tapered sidewall of the pillar body and providing the vertical sidewalls of the first electrode.

DETAILED DESCRIPTION

Figure 1A:
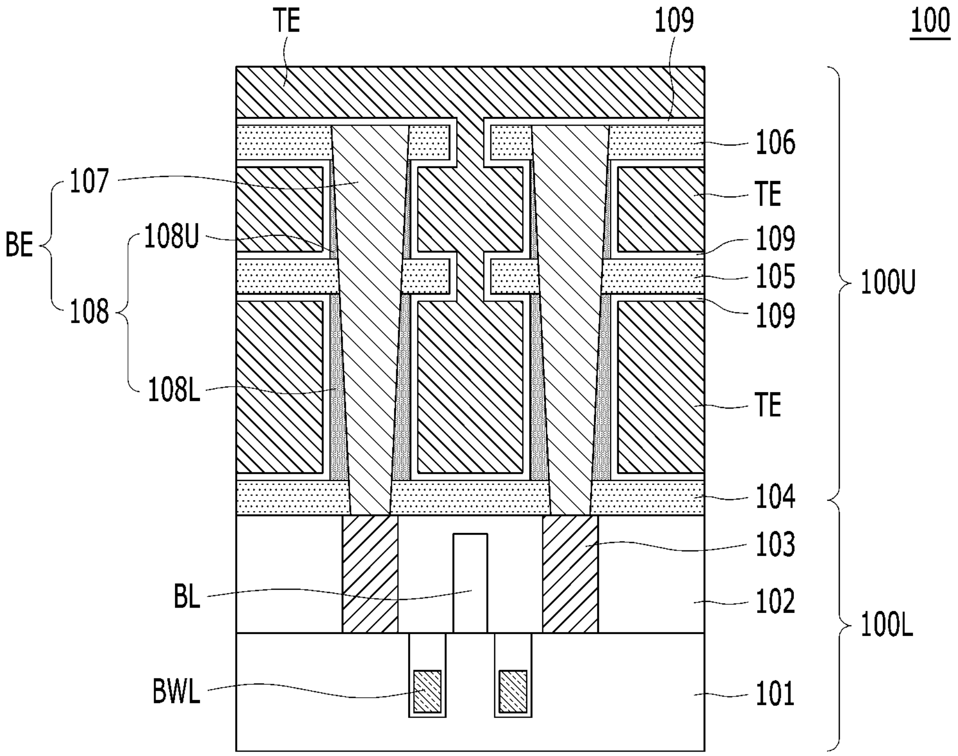
FIG. 1A is a cross-sectional view illustrating a semiconductor device in accordance with one embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
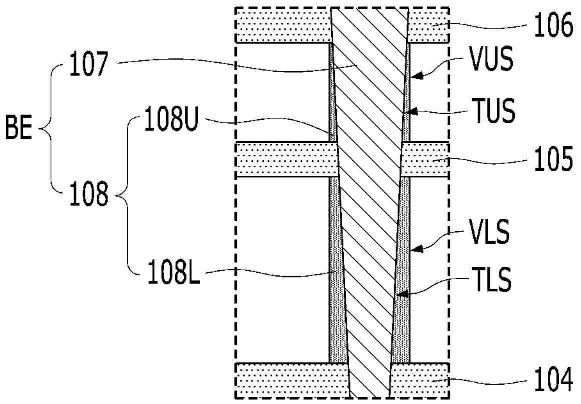
FIG. 1B is a detailed cross-sectional view illustrating a first electrode shown in FIG. 1A.

FIG. 1A is a cross-sectional view illustrating a semiconductor device 100 in accordance with one embodiment of the present invention. FIG. 1B is a detailed cross-sectional view illustrating a first electrode BE shown in FIG. 1A.

Referring to FIGS. 1A and 1B, the semiconductor device 100 may include a lower structure 100L and a data storage element 100U positioned over the lower structure 100L.

The lower structure 100L may include a semiconductor substrate 101, a buried word line BWL formed in the semiconductor substrate 101, and a bit line BL formed over the semiconductor substrate 101. The lower structure 100L may further include an inter-layer dielectric layer 102 and contact plugs 103 formed over the semiconductor substrate 101. The contact plugs 103 may be coupled to portions of the semiconductor substrate 101. The contact plugs 103 may be formed in the inter-layer dielectric layer 102.

The semiconductor substrate 101 of the lower structure 100L may include a material suitable for semiconductor processing. For example, the semiconductor substrate 101 may be formed of a silicon-containing material. The semiconductor substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The semiconductor substrate 101 may also include other semiconductor materials, such as germanium. The semiconductor substrate may include a III/V-group semiconductor substrate, for example, a compound semiconductor substrate, such as GaAs. The semiconductor substrate 101 may include a silicon-on-insulator (SOI) substrate.

As shown in FIG. 1A, a data storage element 100U may be electrically connected to the lower structure 100L through the contact plug 103. The contact plugs 103 may be referred to as storage node contact plugs.

The data storage element 100U may include a capacitor. The data storage element 100U may include an etch stop layer 104, the first electrode BE, a dielectric layer 109, and a second electrode TE. The bottom portion of the first electrode BE may be coupled to the contact plug 103. The first electrode BE may have a pillar shape. The first electrode BE may be referred to as a storage node or a lower electrode. The first electrode BE may be positioned over the semiconductor substrate 101 of the lower structure 100L, and the contact plug 103 may be positioned between the semiconductor substrate 101 and the first electrode BE.

The outer wall of the first electrode BE may be supported by supporters 105 and 106. The supporters 105 and 106 may include a plate-like structure extending horizontally to support a plurality of neighboring first electrodes BE. The supporters 105 and 106 may include at least one or more supporters. For example, the supporters 105 and 106 may include a multi-level dielectric supporter. The supporters 105 and 106 is referred to below as an upper-level supporter 106 and a lower-level supporter 105. The upper-level supporter 106 may support the upper outer wall of the first electrode BE, and the lower-level supporter 105 may be vertically spaced apart from the upper-level supporter 106 to support the outer wall of the first electrode BE. The upper-level supporter 106 may be thicker than the lower-level supporter 105. The distance between the upper-level supporter 106 and the lower-level supporter 105 may be smaller than the distance between the lower-level supporter 105 and the etch stop layer 104. From a perspective of a top view, each of the upper-level supporter 106 and the lower-level supporter 105 may have a plate-like structure. The upper-level supporter 106 and the lower-level supporter 105 may be formed of the same material or different materials. The upper-level supporter 106 and the lower-level supporter 105 may include elements of silicon, boron, nitrogen, oxygen, carbon, or a combination thereof. The upper-level supporter 106 and the lower-level supporter 105 may be formed of the same material or different materials. For example, the upper-level supporter 106 and the lower-level supporter 105 may be formed of silicon nitride, silicon carbon nitride, or silicon boron nitride.

The first electrode BE may include a pillar body 107 and a sealing layer 108. The sealing layer 108 may include an upper-level sealing layer 108U and a lower-level sealing layer 108L. The pillar body 107 may have a vertically oriented pillar shape, and the sealing layer 108 may surround the outer wall of the pillar body 107. As shown in FIG. 1B, the first electrode BE may include an upper-level vertical sidewall VUS and a lower-level vertical sidewall VLS.

The pillar bodies 107 may include polysilicon, a metal, a metal nitride, a conductive metal oxide, a metal silicide, a noble metal, or a combination thereof. The lower electrode BE may be formed of, for example, titanium (Ti), titanium nitride (TiN), tantalum (Ta), tantalum nitride (TaN), titanium aluminum nitride (TiIAlN), tungsten (W), tungsten nitride (WN), ruthenium (Ru), ruthenium oxide ($RuO_2$), iridium (Ir), iridium oxide ($IrO_2$), platinum (Pt), or a combination thereof. The pillar bodies 107 may include titanium nitride (TIN). The pillar bodies 107 may include titanium nitride (ALD-TIN) which is formed by atomic layer deposition (ALD).

The pillar bodies 107 may include upper-level tapered sidewalls TUS and lower-level tapered sidewalls TLS. The upper-level tapered sidewalls TUS and the lower-level tapered sidewalls TLS of the pillar bodies 107 may have a negative slope in which the upper diameter of the pillar bodies 107 is larger than the lower diameter.

The upper-level sealing layers 108U may be formed on the upper-level tapered sidewalls TUS of the pillar bodies 107. The lower-level sealing layers 108L may be formed on the lower-level tapered sidewalls TLS of the pillar bodies 107. The average thickness of the upper-level sealing layers 108U may be smaller than the average thickness of the lower-level sealing layers 108L.

Although the pillar bodies 107 include the upper-level and lower-level tapered sidewalls TUS and TLS, the first electrode BE may be considered to have the upper-level vertical sidewall VUS and the lower-level vertical sidewall VLS due to the upper-level and lower-level sealing layers 108U and 108L.

The sealing layer 108 may include a tapered inner surface and a vertical outer surface, and the tapered inner surface of the sealing layer 108 may contact the tapered sidewall of the pillar body 107. For example, the tapered inner surface of the sealing layer 108 may refer to a portion contacting the upper-level tapered sidewalls TUS and the lower-level tapered sidewalls TLS of the pillar bodies 107. The vertical outer surface of the sealing layer 108 may correspond to the upper-level vertical sidewall VUS and the lower-level vertical sidewall VLS of the first electrode BE. The tapered inner surface of the sealing layer 108 may have a positive slope with a larger diameter at a lower end of the sealing layer 108.

The sealing layers 108 may include a conductive material. The sealing layers 108 may include a conductive oxide, for example, a conductive metal oxide. The sealing layers 108 may include, for example, titanium oxide ($TiO_2$), niobium oxide ($Nb_2O_5$), molybdenum oxide ($MoO_2$), indium oxide ($InO_2$), or a combination thereof. According to another embodiment of the present invention, the sealing layers 108 may include a metal, a metal nitride, or a combination thereof. The sealing layers 108 may include, for example, titanium nitride (TiN), titanium silicon nitride (TiSiN), tungsten nitride (WN), ruthenium (Ru), indium (In), or a combination thereof. According to another embodiment of the present invention, the sealing layers 108 may include a conductive material capable of being deposited by atomic layer deposition (ALD).

The pillar bodies 107 and the sealing layers 108 may be formed of the same material or different materials. Both of the pillar bodies 107 and the sealing layers 108 may be formed of titanium nitride. According to another embodiment of the present invention, the pillar bodies 107 may be titanium nitride, and the sealing layers 108 may be niobium oxide.

The pillar bodies 107 of the first electrode BE may directly contact the upper-level supporter 106 and the lower-level supporter 105. Accordingly, the first electrode BE may further include tapered sidewalls that directly contact the upper-level supporter 106 and the lower-level supporter 105.

The dielectric layer 109 may include a high-k material having a higher dielectric constant than silicon oxide. The high-k material may include, for example, hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$) or a combination thereof. According to another embodiment of the present invention, the dielectric layer 109 may be formed of a composite layer including two or more layers of the aforementioned high-k materials. According to this embodiment of the present invention, the dielectric layer 109 may be formed of a zirconium oxide-based material having a sufficiently low equivalent oxide film thickness (EOT) and good leakage current characteristics. For example, it may include a ZAZ ($ZrO_2/Al_2O_3/ZrO_2$) stack. According to another embodiment of the present invention, the dielectric layer 109 may include, for example, a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, or a $Ta_2O_5/HfO_2/Al_2O_3/HfO_2$ stack.

The sealing layer 108 of the first electrode BE may directly contact the dielectric layer 109, and thus the vertical sidewalls VUS and VLS of the first electrode BE and the dielectric layer 109 may directly contact each other. The tapered sidewalls TUS and TLS of the first electrode BE may directly contact the upper-level and lower-level supporters 106 and 105. The sealing layer 108 may act as a crystallization promoting layer of the dielectric layer 109.

The second electrode TE may include, for example, polysilicon, silicon germanium, a metal, a metal nitride, a conductive metal oxide, a metal silicide, a noble metal, or a combination thereof. The second electrode TE may include at least one among titanium (Ti), titanium nitride (TiN), tantalum (Ta), tantalum nitride (TaN), titanium aluminum nitride (TiIAlN), tungsten (W), tungsten nitride (WN), ruthenium (Ru), ruthenium oxide ($RuO_2$), iridium (Ir), iridium oxide ($IrO_2$), platinum (Pt), and a combination thereof. The second electrode TE may include titanium nitride (TIN). The second electrode TE may include titanium nitride (ALD-TIN) which is formed by atomic layer deposition (ALD). As described above, the first electrode BE may include the vertical sidewalls VUS and VLS and the tapered sidewalls TUS and TLS, and the vertical sidewalls VUS and VLS of the first electrode BE may be provided by the sealing layer 108, and the tapered sidewalls TUS and TLS of the first electrode BE may be provided by the pillar body 107.

FIGS. 2A to 2G are cross-sectional views illustrating an example of a method for fabricating a semiconductor device in accordance with still another embodiment of the present invention.

Figure 2A:
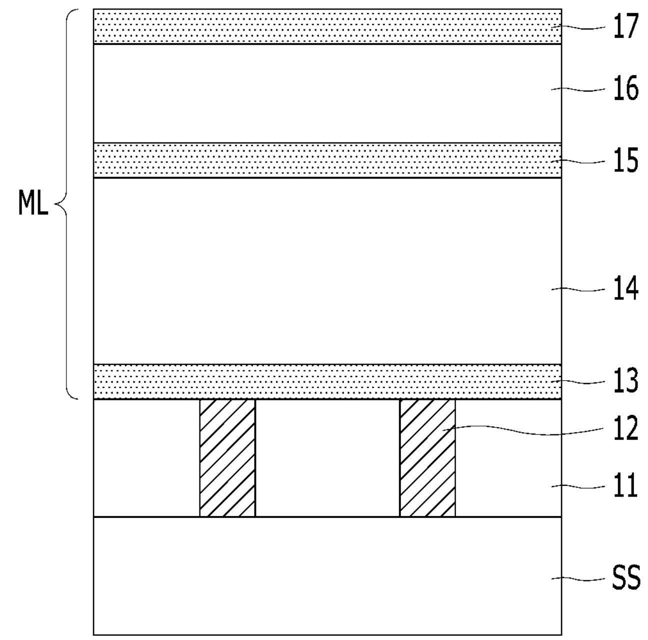
FIGS. 2A to 2G are cross-sectional views illustrating an example of a method for fabricating a semiconductor device in accordance with another embodiment of the present invention.

Referring to FIG. 2A, an inter-layer dielectric layer 11 may be formed over a substrate structure SS. A plurality of contact plugs 12 penetrating the inter-layer dielectric layer 11 may be formed. The contact plugs 12 may pass through the inter-layer dielectric layer 11 to be coupled to the substrate structure SS. The substrate structure SS may include a semiconductor substrate 101 as described by referring to FIG. 1A, a buried word line BWL formed in the semiconductor substrate 101, and a bit line BL formed over the buried word line BWL.

The substrate structure SS may include a material suitable for semiconductor processing. For example, the substrate structure SS may include a semiconductor substrate, and the semiconductor substrate may be formed of a silicon-containing material. The semiconductor substrate may include, for example, silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The semiconductor substrate may also contain other semiconductor materials, such as germanium. The semiconductor substrate may include a III/V-group semiconductor substrate, for example, a compound semiconductor substrate, such as GaAs. The semiconductor substrate may include a silicon-on-insulator (SOI) substrate.

The inter-layer dielectric layer 11 may include silicon oxide. The inter-layer dielectric layer 11 may be formed of, for example, high density plasma oxide (HDP oxide), TEOS (TetraEthylOrthoSilicate), PE-TEOS (Plasma Enhanced TetraEthylOrthoSilicate), $O_3$-TEOS ($O_3$-Tetra Ethyl Ortho Silicate), USG (Undoped Silicate Glass), PSG (PhosphoSilicate Glass), BSG (Borosilicate Glass), BPSG (BoroPhosphoSilicate Glass), FSG (Fluoride Silicate Glass), SOG (Spin On Glass), TOSZ (Tonen SilaZene), or a combination thereof. Also, the inter-layer dielectric layer 11 may be formed of silicon nitride, silicon oxynitride, or a low-k material having a low dielectric constant.

The contact plugs 12 may include a silicon plug, a metal plug, or a combination thereof. The contact plugs 12 may be referred to as storage node contact plugs.

A mold structure ML may be formed over the contact plugs 12 and the inter-layer dielectric layer 11. The mold structure ML may include an etch stop layer 13 and an alternating stack formed over the etch stop layer 13. The alternating stack may be formed by alternately stacking a plurality of mold layers and a plurality of supporter layers. For example, the mold structure ML may include a stack of an etch stop layer 13, a first mold layer 14, a first supporter layer 15, a second mold layer 16, and a second supporter layer 17. The etch stop layer 13 may be formed of a material having an etch selectivity with respect to the inter-layer dielectric layer 11 and the first mold layer 14. The etch stop layer 13 may include silicon nitride or silicon oxynitride. According to another embodiment of the present invention, the mold structure ML may be formed by sequentially stacking the etch stop layer 13, one mold layer, and one supporter layer. According to another embodiment of the present invention, the mold structure ML may be formed by alternately stacking at least three or more mold layers and at least three or more supporter layers formed over the etch stop layer 13.

The first mold layer 14 may include a dielectric material. The first mold layer 14 may be a silicon oxide ($SiO_2$)-based material. The first mold layer 14 may be formed thicker than the first supporter layer 15. The first mold layer 14 may be formed by a deposition process, such as chemical vapor deposition (CVD), atomic layer deposition (ALD), or physical vapor deposition (PVD). The first mold layer 14 may include silicon oxide that is doped with phosphorus or silicon oxide that is doped with boron. The first mold layer 14 may include USG, PSG, BSG, BPSG, FSG, or a combination thereof. The phosphorus-doped silicon oxide and the boron-doped silicon oxide may be removed in a subsequent process because their etching rate for the etching solution is fast.

The first supporter layer 15 may be formed of a material having an etching selectivity with respect to the first mold layer 14 and the second mold layer 16. The first supporter layer 15 may include silicon nitride or silicon carbon nitride (SiCN).

The second mold layer 16 may include a dielectric material. The second mold layer 16 may be a silicon oxide ($SiO_2$)-based material. The second mold layer 16 may be formed thicker than the first supporter layer 15. The second mold layer 16 may be formed by a deposition process, such as chemical vapor deposition (CVD), atomic layer deposition (ALD), or physical vapor deposition (PVD). The second mold layer 16 may include silicon oxide that is doped with phosphorus or silicon oxide that is doped with boron. The second mold layer 16 may include USG, PSG, BSG, BPSG, FSG, or a combination thereof. The first mold layer 14 and the second mold layer 16 may be formed of the same material or different materials.

According to another embodiment of the present invention, the first mold layer 14 and the second mold layer 16 may be a silicon material, such as amorphous silicon or polysilicon.

The second supporter layer 17 may be formed of a material having an etching selectivity with respect to the second mold layer 16. The second supporter layer 17 may include silicon nitride or silicon carbon nitride (SiCN).

The first supporter layer 15 and the second supporter layer 17 may be formed of the same material or different materials. Both of the first supporter layer 15 and the second supporter layer 17 may be formed of silicon nitride. According to another embodiment of the present invention, the first supporter layer 15 may be formed of silicon nitride, and the second supporter layer 17 may be formed of silicon carbon nitride. The second supporter layer 17 may be thicker than the first supporter layer 15.

According to another embodiment of the present invention, another supporter layer may be further formed. For example, the supporter structure may be a multi-level supporter layer structure.

Figure 2B:
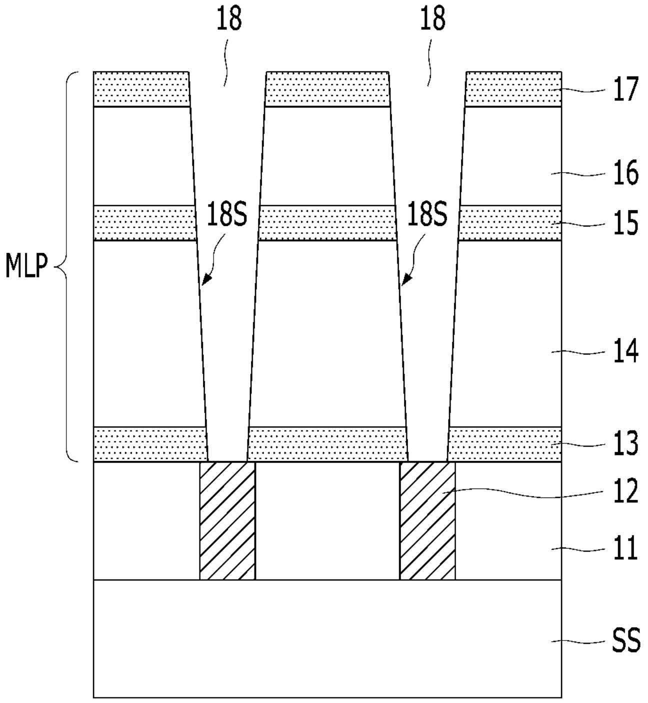

Referring to FIG. 2B, an opening 18 may be formed. The opening 18 may be formed by etching the mold structure ML using a mask layer. The opening 18 may be formed by sequentially etching the second supporter layer 17, the second mold layer 16, the first supporter layer 15, and the first mold layer 14. The etching process for forming the opening 18 may stop at the etch stop layer 13. The opening 18 may be formed by a dry etching process, a wet etching process, or a combination thereof.

Subsequently, the etch stop layer 13 may be etched to expose the upper surfaces of the contact plugs 12 below the opening 18.

The mask layer for forming the opening 18 may include a hard mask material, a photoresist, or a combination thereof. For example, the hard mask material may include boron-doped polysilicon, amorphous silicon, an oxide, amorphous carbon, silicon oxynitride, or a combination thereof. The photoresist may include argon fluoride (ArF) photoresist or Extreme Ultra Violet (EUV) photoresist.

The opening 18 may be formed by a double patterning process. For example, the mask layer for forming the opening 18 may be of a mesh-shape that is formed by combining a spacer patterning process performed twice.

A mold pattern MLP including a plurality of the openings 18 may be formed through a series of the etching processes described above. The mold pattern MLP may be a structure in which an etch stop layer 13, a first mold layer 14, a first supporter layer 15, a second mold layer 16, and a second supporter layer 17 are stacked in the mentioned order.

The openings 18 may include a tapered sidewall 18S. The lower width of the openings 18 may be smaller than the upper width of the openings 18 due to the tapered sidewall 18S. The tapered sidewall 18S may have a positive slope.

Figure 2C:
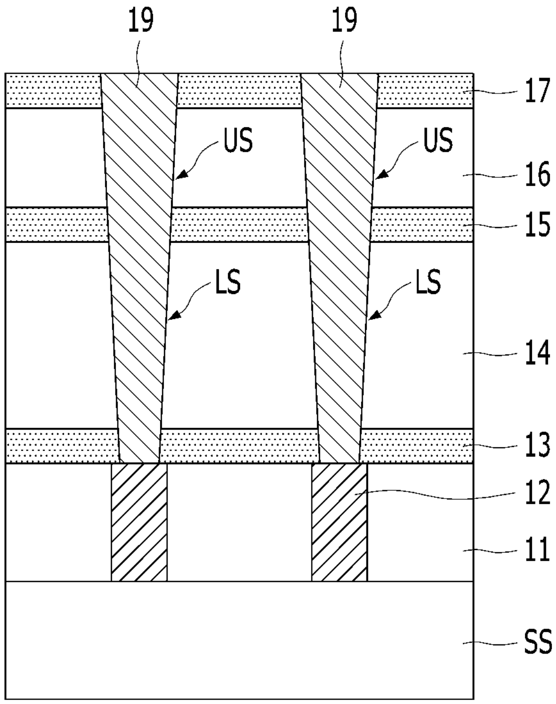

Referring to FIG. 2C, pillar bodies 19 may be formed in the openings 18 of the mold pattern MLP. The pillar bodies 19 may fill the openings 18. The body electrode 19 may have a pillar shape extending vertically from the surfaces of the contact plugs 12. The pillar bodies 19 may be formed by depositing a conductive material to gap-fill the openings 18 and then performing a planarization process. The pillar bodies 19 may include, for example, at least one among polysilicon, a metal, a metal nitride, a conductive metal oxide, a metal silicide, a noble metal, or a combination thereof. The first electrode BE formed by the pillar bodies 19 may include, for example, titanium (Ti), titanium nitride (TiN), tantalum (Ta), tantalum nitride (TaN), titanium aluminum nitride (TiIAlN), tungsten (W), tungsten nitride (WN), ruthenium (Ru), ruthenium oxide ($RuO_2$), iridium (Ir), iridium oxide ($IrO_2$), platinum (Pt), and a combination thereof. The pillar bodies 19 may include titanium nitride (TIN). The pillar bodies 19 may include titanium nitride (ALD-TIN) formed by an atomic layer deposition (ALD) process.

The pillar bodies 19 may include a lower-level sidewall LS and an upper-level sidewall US. The lower-level sidewalls LS of the pillar bodies 19 may contact the first mold layer 14, and the upper-level sidewalls US of the pillar bodies 19 may contact the second mold layer 16.

The heights of the lower-level sidewalls LS of the pillar bodies 19 may be greater than the heights of the upper-level sidewalls US. The lower-level sidewalls LS and the upper-level sidewalls US of the pillar bodies 19 may have a tapered shape.

Each of the pillar bodies 19 may further include supporter layer level sidewalls. The supporter layer level sidewalls refer to the sidewalls contacting the first supporter layer 15 and the second supporter layer 17. Each of the pillar bodies 19 may further include etch stop layer level sidewalls. The etch stop layer level sidewalls refer to the sidewalls contacting the etch stop layer 13.

Figure 2D:
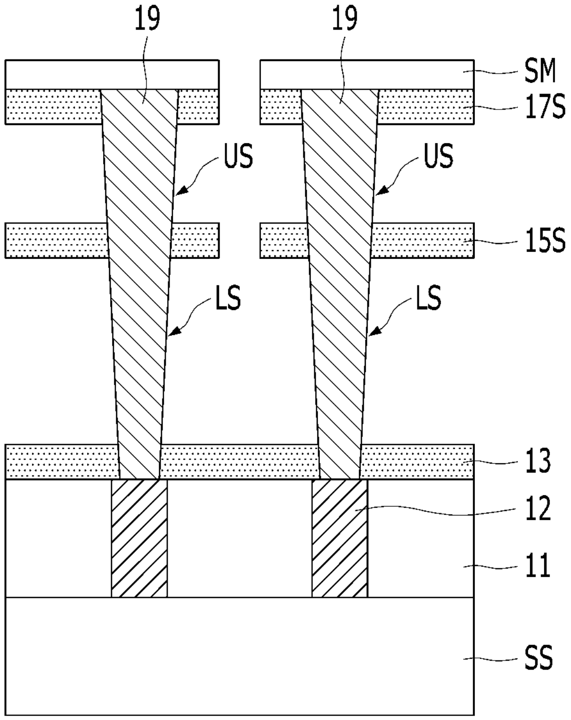

Referring to FIG. 2D, a supporter mask layer SM may be formed. The supporter mask layer SM may include a photoresist or amorphous carbon.

Subsequently, a plurality of supporters may be formed by an etching process using the supporter mask layer SM. The supporters may include an upper-level supporter 17S and a lower-level supporter 15S.

First, a part of the second supporter layer 17 may be etched using the supporter mask layer SM. The upper-level supporter 17S may be formed as a result of etching the second supporter layer 17.

The upper-level supporter 17S may be a plate-shaped supporter. The upper-level supporter 17S may contact the upper outer wall of the pillar bodies 19. Some surfaces of the second mold layer 16 may be exposed by the upper-level supporter 17S. The upper-level supporter 17S may have a shape that partially surrounds the upper outer wall of the pillar bodies 19. The upper-level supporter 17S may prevent the pillar bodies 19 from collapsing in a subsequent process of removing the second mold layer 16.

Subsequently, the second mold layer 16 below the upper-level supporter 17S may be removed. The second mold layer 16 may be removed by a wet dip-out process. The second mold layer 16 may be selectively removed, and as a result, the surface of the first supporter layer 15 may be exposed. The wet dip-out process for removing the second mold layer 16 may be performed using an etching solution capable of selectively removing the second mold layer 16. When the second mold layer 16 includes silicon oxide, the second mold layer 16 may be removed by a wet etching process using hydrofluoric acid (HF).

After removing the second mold layer 16, the upper-level sidewalls US of the pillar bodies 19 may be exposed.

Subsequently, the first supporter layer 15 may be etched to form the lower-level supporter 15S. The process of etching the first supporter layer 15 may be performed by a self-alignment etching process using the supporter mask layer SM. The lower-level supporter 15S and the upper-level supporter 17S may vertically overlap with each other. From a perspective of a top view, the upper-level supporter 17S and the lower-level supporter 15S may have the same shape.

Subsequently, the first mold layer 14 may be removed to expose the lower-level sidewalls LS of the pillar bodies 19. The first mold layer 14 may be removed by a wet dip-out process. The first mold layer 14 may be selectively removed, and as a result, the surface of the etch stop layer 13 may be exposed. The wet dip-out process for removing the first mold layer 14 may be performed using an etching solution capable of selectively removing the first mold layer 14. When the first mold layer 14 includes silicon oxide, the first mold layer 14 may be removed by a wet etching process using hydrofluoric acid (HF).

As described above, as the first mold layer 14 is removed, the lower-level sidewalls LS of the pillar bodies 19 may be exposed, and as the second mold layer 16 is removed, the upper-level sidewalls US of the pillar bodies 19 may be exposed.

Figure 2E:
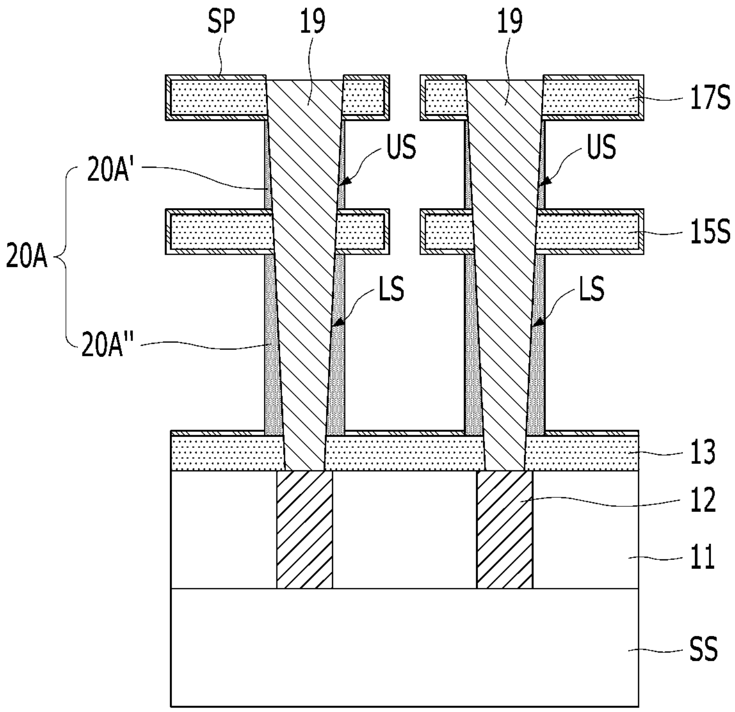
Figure 2F:
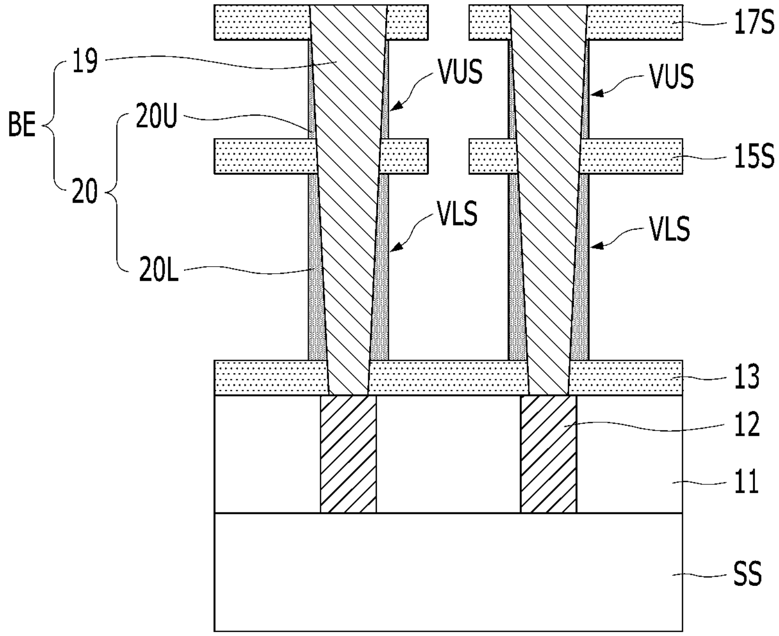

Referring to FIGS. 2E and 2F, after removing the supporter mask layer SM, sealing layers 20 may be formed. The sealing layers 20 may be formed on the upper-level sidewalls US and the lower-level sidewalls LS of the pillar bodies 19. The sealing layers 20 may include upper-level sealing layers 20U and lower-level sealing layers 20L. The upper-level sealing layers 20U may be formed on the upper-level sidewalls US of the pillar bodies 19. The lower-level sealing layers 20L may be formed on the lower-level sidewalls LS of the pillar bodies 19. The average thickness of the upper-level sealing layers 20U may be smaller than the average thickness of the lower-level sealing layers 20L.

The sealing layers 20 may include a conductive material. The sealing layers 20 may include a conductive oxide, for example, a conductive metal oxide. The sealing layers 20 may include, for example, titanium oxide ($TiO_2$), niobium oxide ($Nb_2O_5$), molybdenum oxide ($MoO_2$), indium oxide ($InO_2$), or a combination thereof. According to another embodiment of the present invention, the sealing layers 20 may include a metal, a metal nitride, or a combination thereof. The sealing layers 20 may include, for example, titanium nitride (TiN), titanium silicon nitride (TiSiN), tungsten nitride (WN), ruthenium (Ru), indium (In), or a combination thereof. According to another embodiment of the present invention, the sealing layers 20 may include a conductive material appropriate for atomic layer deposition (ALD).

A method for forming the sealing layers 20 may be as follows.

For example, the sealing layers 20 may be formed by an area selective deposition (ASD) process. The ASD process may include a surface inhibitor (SP) adsorption process, a process of selectively depositing the sealing material layer 20A, and a process of etching a sealing material layer 20A to form the sealing layers 20. The sealing material layer 20A may be selectively formed on the exposed negative tapered sidewall of the pillar body 19 by the ASD process. The sealing material layer 20A may include a conductive metal oxide, a conductive material, or a combination thereof. The ASD process for forming the sealing material layer 20A may include an atomic layer deposition cycle of a conductive metal oxide. The atomic layer deposition cycle of a conductive metal oxide may include a pre-treatment for adsorbing the surface inhibitor. With the surface suppressor, the conductive metal oxide may be deposited at a higher deposition rate on the surface of the pillar body 19 than on the surface of the supports 15S and 17S. The sealing material layer 20A may include, for example, titanium oxide ($TiO_2$), niobium oxide ($Nb_2O_5$), molybdenum oxide ($MoO_2$), indium oxide ($InO_2$), titanium nitride (TiN), titanium silicon nitride (TiSiN), tungsten nitride (WN), ruthenium (Ru), indium (In), or a combination thereof. The surface inhibitor SP may be adsorbed on the surface of the etch stop layer 13, on the surface of the upper-level supporter 17S, and on the surface of the lower-level supporter 15S. The sealing material layer 20A may be selectively deposited on the surface of the pillar bodies 19. The sealing material layer 20A may include upper-level sealing material layers 20A' and lower-level sealing material layers 20A". The upper-level sealing material layers 20A' may be formed on the upper-level sidewalls US of the pillar bodies 19. The lower-level sealing material layers 20A" may be formed on the lower-level sidewalls LS of the pillar bodies 19. The average thickness of the upper-level sealing material layers 20A' may be smaller than the average thickness of the lower-level sealing material layers 20A".

The surface suppressor SP may include a material capable of controlling a thickness deposited on the surface of the pillar bodies 19 in the deposition process of the sealing material layer 20A. The surface inhibitor SP may suppress or minimize the deposition of the sealing material layer 20A on the surface of the etch stop layer 13, on the surface of the upper-level supporter 17S, and on the surface of the lower-level supporter 15S. For example, the surface inhibitor SP may include tetrahydrofuran (THF).

The sealing layers 20 may be formed by etching the sealing material layer 20A. The upper-level sealing layers 20U may be formed by etching the upper-level sealing material layers 20A', and the lower-level sealing layers 20L may be formed by etching the lower-level sealing material layers 20A".

In another example, the forming of the sealing layers 20 may include a process of depositing the sealing material layer 20A and a process of etching the sealing material layer 20A to form the sealing layers 20. The sealing material layer 20A may be adsorbed on the surface of the etch stop layer 13, on the surface of the upper-level supporter 17S, on the surface of the lower-level supporter 15S, and on the surface of the first electrodes BE. The sealing material layer 20A may include a conductive metal oxide, a conductive material, or a combination thereof. For example, the sealing material layer 20A may include titanium oxide ($TiO_2$), niobium oxide ($Nb_2O_5$), molybdenum oxide ($MoO_2$), indium oxide ($InO_2$), titanium nitride (TiN), titanium silicon nitride (TiSiN), tungsten nitride. (WN), ruthenium (Ru), indium (In), or a combination thereof.

As the sealing layers 20 are formed by a series of the processes as described by referring to FIGS. 2E and 2F, a first electrode BE Including the pillar body 19 and the sealing layers 20 may be formed.

As shown in FIG. 2F, the first electrode BE may include a vertical sidewall. The first electrode BE may include an upper-level vertical sidewall VUS and a lower-level vertical sidewall VLS. The upper-level vertical sidewall VUS and the lower-level vertical sidewall VLS may have a profile perpendicular to the surfaces of the upper-level supporter 17S and the lower-level supporter 15S.

Figure 2G:
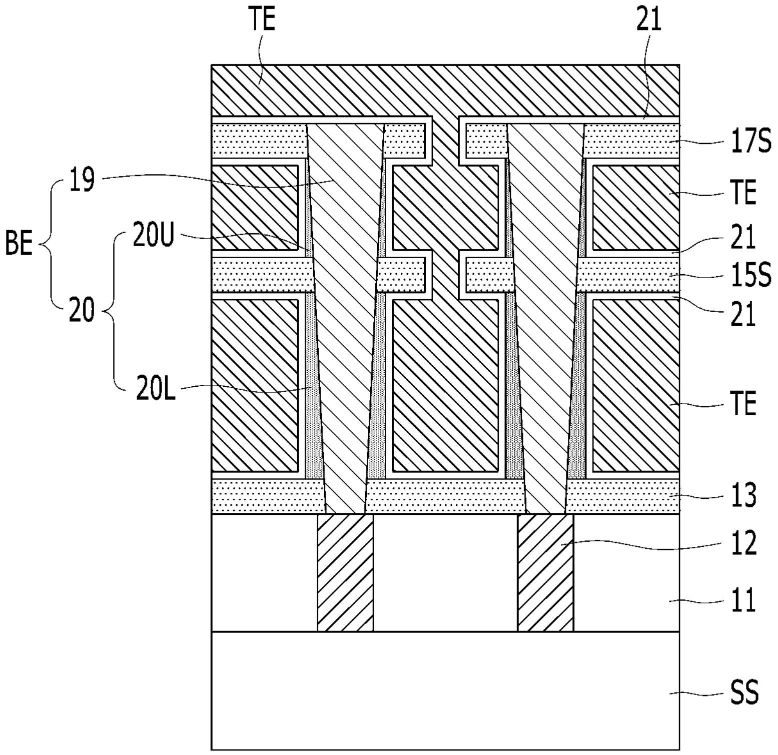

Referring to FIG. 2G, a dielectric layer 21 may be formed over the first electrode BE. The dielectric layer 21 may include a high-k material having a higher dielectric constant than silicon oxide. The high-k material may include, for example, hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer 21 may be formed of a composite layer Including two or more layers of the aforementioned high-k materials. According to this embodiment of the present invention, the dielectric layer 21 may be formed of a zirconium oxide-based material having a sufficiently low equivalent oxide film thickness (EOT) and good leakage current characteristics. For example, it may include a ZAZ ($ZrO_2/Al_2O_3/ZrO_2$) stack. According to another embodiment of the present invention, the dielectric layer 21 may include a $TiO_2/ZrO_2/Al_2O_3/ZrO_2$ stack, a $TiO_2/HfO_2/Al_2O_3/HfO_2$ stack, a $Ta_2O_5/ZrO_2/Al_2O_3/ZrO_2$ stack, or a $Ta_2O_5/HfO_2/Al_2O_3/HfO_2$ stack.

During the formation of the dielectric layer 21, the sealing layers 20 may act as a crystallization promoting layer of the dielectric layer 21.

Subsequently, a second electrode TE may be formed over the dielectric layer 21. The second electrode TE may fill the space between the neighboring first electrodes BE. The second electrode TE may extend to cover the upper surfaces of the first electrodes BE. The second electrode TE may include a conductive material. The second electrode TE may be formed by stacking a liner electrode, a gap-fill electrode, and a low resistance electrode (reference numerals are omitted) in the mentioned order. The liner electrode of the second electrode TE may include titanium nitride, and the gap-fill electrode of the second electrode TE may include silicon germanium. The low resistance electrode of the second electrode TE may include tungsten or tungsten nitride.

As described above, since the sidewall profile of the first electrode BE is formed as a vertical profile, it is possible to maintain the same dimensions in the top and bottom portions of the first electrode BE. Accordingly, it may be possible to increase the area of the data storage element (such as data storage element 100U shown in FIG. 1A). Also, the reliability of the data storage element may be improved by reducing the curvature of the bottom portion of the first electrode BE to improve the asymmetry of the breakdown voltage. Also, various types of electrical characteristics may be improved according to the conductive material that is used as the first electrode BE. For example, when a conductive material having a high work function is used, an effect of improving capacitance leakage may be obtained. Also, when a material having the same crystal structure as that of the dielectric layer 21 is used as the sealing layer 20, it may serve as a crystallization promoting layer.

According to one embodiment of the present invention, since the sidewall of the first electrode of a data storage element includes a vertical profile, the reliability of the data storage element may be improved.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
a data storage element including a first electrode disposed over a semiconductor substrate and a lower-level supporter supporting an outer wall of the first electrode,
wherein the first electrode includes:
a pillar body which is oriented perpendicular to a surface of the semiconductor substrate and which includes a tapered sidewall; and
a sealing layer covering the tapered sidewall of the pillar body,
wherein the sealing layer includes an upper-level sealing layer having a tapered inner surface and a vertical outer surface and a lower-level sealing layer having a tapered inner surface and a vertical outer surface, and
wherein the lower-level supporter is disposed between the upper-level sealing layer and the lower-level sealing layer.

2. The semiconductor device of claim 1, wherein the outer wall of the first electrode includes a vertical sidewall which is defined by the sealing layer.

3. The semiconductor device of claim 1, wherein the tapered sidewall of the pillar body has a negative slope.

4. The semiconductor device of claim 1, wherein a diameter of a bottom portion of the pillar body is smaller than a diameter of a top portion of the pillar body.

5. The semiconductor device of claim 1,
wherein the pillar body includes a vertically oriented pillar shape, and
wherein an outer wall of the pillar body is surrounded by the sealing layer.

6. The semiconductor device of claim 1,
wherein the tapered inner surface of the sealing layer contacts the tapered sidewall of the pillar body.

7. The semiconductor device of claim 6, wherein the tapered inner surface of the sealing layer has a positive slope.

8. The semiconductor device of claim 1, wherein the pillar body includes at least one of polysilicon, a metal, a metal nitride, a conductive metal oxide, a metal silicide, and a noble metal.

9. The semiconductor device of claim 1, wherein the sealing layer includes a conductive metal oxide.

10. The semiconductor device of claim 1, wherein the sealing layer includes at least one of titanium oxide ($TiO_2$), niobium oxide ($Nb_2O_5$), molybdenum oxide ($MoO_2$), and indium oxide ($InO_2$).

11. The semiconductor device of claim 1, wherein the sealing layer includes at least one of a metal and a metal nitride.

12. The semiconductor device of claim 1, wherein the data storage element further includes:
an upper-level supporter supporting the outer wall of the first electrode,
a dielectric layer covering the upper-level supporter, the lower-level supporter, and the first electrode; and
a second electrode disposed over the dielectric layer.

13. The semiconductor device of claim 1,
wherein an average thickness of the upper-level sealing layer is smaller than an average thickness of the lower-level sealing layer.

14. The semiconductor device of claim 12,
wherein the lower-level supporter is vertically spaced apart from the upper-level supporter.

15. The semiconductor device of claim 12,
wherein the upper-level supporter is thicker than the lower-level supporter.

16. The semiconductor device of claim 12,
wherein the upper-level supporter and the lower-level supporter include silicon, boron, nitrogen, oxygen, carbon, or a combination thereof.

17. The semiconductor device of claim 12,
wherein the upper-level supporter and the lower-level supporter include the same material.

18. The semiconductor device of claim 12,
wherein the lower-level supporter and the upper-level supporter vertically overlap each other.

* * * * *